United States Patent [19]
Silver

[11] Patent Number: 5,776,863
[45] Date of Patent: Jul. 7, 1998

[54] IN-SITU FABRICATION OF A SUPERCONDUCTOR HETERO-EPITAXIAL JOSEPHSON JUNCTION

[75] Inventor: Arnold H. Silver, Rancho Palos Verdes, Calif.

[73] Assignee: TRW Inc., Redondo Beach, Calif.

[21] Appl. No.: 676,793

[22] Filed: Jul. 8, 1996

[51] Int. Cl.$^6$ ............................................. H01L 39/24
[52] U.S. Cl. ........................... 505/329; 505/190; 505/238; 505/702; 427/62
[58] Field of Search ........................... 505/329, 190, 505/238, 702; 257/33, 34, 35; 427/62, 63

[56] References Cited

U.S. PATENT DOCUMENTS

| | | | |
|---|---|---|---|
| 5,087,605 | 2/1992 | Hegde | 505/1 |
| 5,225,398 | 7/1993 | Nakanishi | 505/1 |
| 5,250,817 | 10/1993 | Fink | 257/35 |
| 5,256,636 | 10/1993 | Wellstood | 505/1 |
| 5,266,558 | 11/1993 | Lichtenberg | 505/1 |
| 5,286,336 | 2/1994 | Chan | 156/643 |
| 5,292,718 | 3/1994 | Tanaka | 505/1 |
| 5,304,538 | 4/1994 | Vasquez | 505/190 |
| 5,304,817 | 4/1994 | Ishida | 257/31 |
| 5,354,734 | 10/1994 | Tanaka | 505/329 |
| 5,358,927 | 10/1994 | Inam | 505/434 |
| 5,358,928 | 10/1994 | Ginley | 525/192 |
| 5,366,953 | 11/1994 | Char | 505/329 |
| 5,367,178 | 11/1994 | DiIorio | 505/190 |
| 5,378,683 | 1/1995 | Cabanel | 505/190 |
| 5,382,566 | 1/1995 | Tanaka | 505/329 |
| 5,399,881 | 3/1995 | Bozovic | 505/190 |
| 5,422,337 | 6/1995 | Tanaka | 505/190 |
| 5,422,497 | 6/1995 | Saitoh | 257/35 |
| 5,430,012 | 7/1995 | Nakamura | 505/234 |
| 5,627,139 | 5/1997 | Chin et al. | 505/238 |

FOREIGN PATENT DOCUMENTS 1-241874  9/1989  Japan.

OTHER PUBLICATIONS

DiIorio et al, Appl. Phys. Lett. 58(22) Jun. 1991, pp. 2552–2554.
Gao et al, Physica C 171 (1990) pp. 126–130.
Marx et al, Appl. Phys. Lett. 64(2), Jan. 1994, pp. 241–243.
Char et al, Appl. Phys. Lett. 63(17) Oct. 1993, pp. 2420–2422.

*Primary Examiner*—Roy V. King
*Attorney, Agent, or Firm*—Michael S. Yatsko

[57] ABSTRACT

A method of in-situ fabrication of a Josephson junction having a laminar structure, the method comprising the steps of: (1) etching a planar substrate to yield a first planar segment, a second planar segment and a ramp segment, the ramp segment connecting the two planar segments at an angle thereto and the substrate having a constantly-decreasing thickness in the ramp segment; (2) depositing a first superconductive layer on the substrate; (3) depositing a non-superconductive layer on the first superconductive layer; and (4) depositing a second superconductive layer on the non-superconductive layer, wherein both the first and second superconductive layers, and the non-superconductive layer are epitaxial with a c-axis in a direction substantially normal to the plane of the first and second planar segments, and the layers are of substantially uniform thickness in the three segments.

18 Claims, 7 Drawing Sheets etching a planar substrate to yield a first planar segment, a second planar segment, and a ramp segment, the ramp segment connecting the two planar segments at an angle thereto, the substrate being thinner in the second planar segment than in the first planar segment, and the substrate having a constantly-decreasing thickness in the ramp segment depositing a first superconductive layer on the substrate depositing a non-superconductive layer on the first superconductive layer depositing a second superconductive layer on the non-superconductive layer

FIG. 1

IN-SITU FABRICATION OF A SUPERCONDUCTOR HETERO-EPITAXIAL JOSEPHSON JUNCTION

BACKGROUND

The present invention generally relates to high-temperature superconductor Josephson junctions, and in particular to high-temperature superconductor hetero-epitaxial Josephson junctions.

With the steady demand for faster and more efficient communication and processing systems, many manufacturers wish to utilize high-temperature superconductor (HTS) components in digital circuits because of low power consumption and operational speed of HTS components. In particular, HTS Josephson junctions and Superconductive Quantum Interference Devices (SQUID) incorporating HTS Josephson junctions are principally used as active devices in various circuit families such as single-flux quantum and series array interferometer logic circuits.

Existing HTS Josephson junctions are fabricated by depositing an epitaxial C-axis HTS and dielectric bilayer on a substrate or dielectric layer. The layers are etched at a shallow angle by ion milling to create an etched edge, and then a thin epitaxial non-superconducting barrier and a HTS layer are sequentially grown over the etched edge to form a junction. Junction characteristics are controlled by the composition and thickness of the barrier, and the interfaces between the barrier film and the two HTS layers.

Existing HTS Josephson junctions have several disadvantages however. One such disadvantage is due to the etching process which damages and exposes the etched edge of the lower YBCO layer to contamination and enhanced oxygen loss. The etched edge is contaminated by litho chemicals, chemical cleaning agents, redeposition during ion milling, and gas absorption during handling and wafer transfer. The variability of the etched profile, the physical damage from ion milling or other etching, and contamination of the edge severely compromise electrical quality, reproducibility, and yield of the junction.

Another disadvantage of existing HTS Josephson junctions is that their fabrication process does not allow integration of the junctions with other circuit elements to meet the requirements of robust high performance circuits.

Yet another disadvantage of existing HTS Josephson junctions is due to anisotropy and short coherence length of HTS materials such as YBCO which hinder formation of junctions and low-resistance contacts by utilizing current flow in the a/b-crystallographic directions. It is highly desirable to produce high quality ohmic contacts between c-axis HTS films and resistive films for integrated resistors and input/output (I/O) contact pads. It is also desirable to produce high quality superconducting contacts between different c-axis HTS films of an integrated circuit structure.

A further disadvantage of existing HTS Josephson junctions is lack of planarized topology junctions. Planar junctions simplify processing, improve electrical performance, and increase circuit robustness and yield.

There is, therefore, a need for a method of fabricating a HTS Josephson junction with high electrical quality, reproducibility, and yield. There is also a need for such a method to allow integration of the junctions with other circuit elements to meet the requirements of robust high performance circuits. There is also a need for such a method to facilitate formation of junctions and low-resistance contacts by utilizing current flow in the a/b-crystallographic directions. There is also a need for a planar HTS Josephson junction and a method of fabricating such a planar junction.

SUMMARY

The present invention satisfies these needs. The present invention provides a method of in-situ fabrication of a Josephson junction having a laminar structure, the method comprising the steps of: (a) etching a planar substrate to yield a first planar segment, a second planar segment, and a ramp segment, the ramp segment connecting the two planar segments at an angle thereto, the substrate being thinner in the second planar segment than in the first planar segment, and the substrate having a constantly-decreasing thickness in the ramp segment; (b) depositing a first superconductive layer on the substrate; (c) depositing a non-superconductive layer on the first superconductive layer; and (d) depositing a second superconductive layer on the non-superconductive layer. Both superconductive layers and the non-superconductive layer are deposited in-situ and are epitaxial with a c-axis in a direction substantially normal to the plane of the first and second planar segments, and the layers are of substantially uniform thickness in the three segments.

Preferably, the step of etching includes etching the substrate so that the angle of the ramp segment to the planar segments is at most about 45 degrees, and more preferably, less than about 30 degrees. The first and the second superconductive layers are preferably high temperature superconductors. The method can further comprise the step of removing the first and/or the second planar segments of the laminar structure after the step of depositing the second superconductive layer. The method can further comprise the step of disabling conductivity in the first and/or the second planar segments of the laminar structure after the step of depositing the second superconductive layer to substantially confine conductivity to the ramp segment of the laminar structure.

The present invention also provides a Josephson junction comprising a laminar structure having: (a) a substrate; (b) a first superconductive layer deposited on the substrate; (c) a non-superconductive layer deposited on the first superconductive layer; and (d) a second superconductive layer deposited on the non-superconductive layer. The laminar structure has three segments, a first planar segment, a second planar segment, and a ramp segment connecting the two planar segments at an angle thereto. The layers are of substantially uniform thickness in the three segments, with the substrate being thinner in the second planar segment than in the first planar segment, and the substrate having a constantly-decreasing thickness in the ramp segment. Both superconductive layers and the non-superconductive layer are epitaxial with a c-axis in a direction substantially normal to the planes of the first and second planar segments. Preferably, the angle of the ramp segment to the planar segments is at most about 45 degrees, and more preferably, less than about 30 degrees. Preferably, the first and second superconductive layers are high temperature superconductors.

In another aspect the present invention provides a method of fabricating a Josephson junction comprising the steps of: (a) polishing an epitaxial substrate to yield a planar epitaxial substrate of substantially uniform thickness, the planar substrate having an epitaxial c-axis at an acute angle to the normal to the plane of the planar substrate; (b) depositing a first superconductive layer on the planar substrate; (c) depositing a non-superconductive layer on the first superconductive layer; and (d) depositing a second superconductive layer on the non-superconductive layer. Both the superconductive layers and the non-superconductive layer are epitaxial with a c-axis in a direction substantially parallel to the c-axis of the planar substrate. The first superconductive layer, the non-superconductive layer and the second superconductive layer are of substantially uniform thickness, whereby the laminar structure is substantially planar.

Preferably, the c-axes of the planar substrate, both the superconductive layers and the non-superconductive layer are at an angle of at most about 45 degrees to the normal to the plane of the planar substrate, and more preferably, less than about 30 degrees. Preferably, the first and the second superconductive layers are selected from the group consisting essentially of high temperature superconductors.

The present invention also provides a Josephson junction comprising a laminar structure having: (a) a planar epitaxial substrate having a c-axis at an acute angle to the normal to the plane of the substrate, the substrate being of substantially uniform thickness; (b) a first superconductive layer deposited on the substrate; (c) a non-superconductive layer deposited on the first superconductive layer; and (d) a second superconductive layer deposited on the non-superconductive layer. Both superconductive layers and the non-superconductive layer are epitaxial with a c-axis in a direction substantially parallel to the c-axis of the substrate. The first superconductive layer, the non-superconductive layer, and the second superconductive layer are of substantially uniform thickness, whereby the laminar structure is substantially planar.

Preferably, the c-axes of the planar substrate, both the superconductive layers, and the non-superconductive layer are at an angle of at most about 45 degrees to the normal to the plane of the planar substrate, and more preferably less than about 30 degrees. Preferably, the first and second superconductive layers are selected from the group consisting essentially of high temperature superconductors.

In another aspect the present invention provides Josephson junctions fabricated in accordance with the above methods.

DRAWINGS

These and other features, aspects and advantages of the present invention will become understood with reference to the following description, appended claims and accompanying drawings where:

FIG. 1 illustrates the steps of fabricating a Josephson junction according to the present invention;

DESCRIPTION

Figure 2:
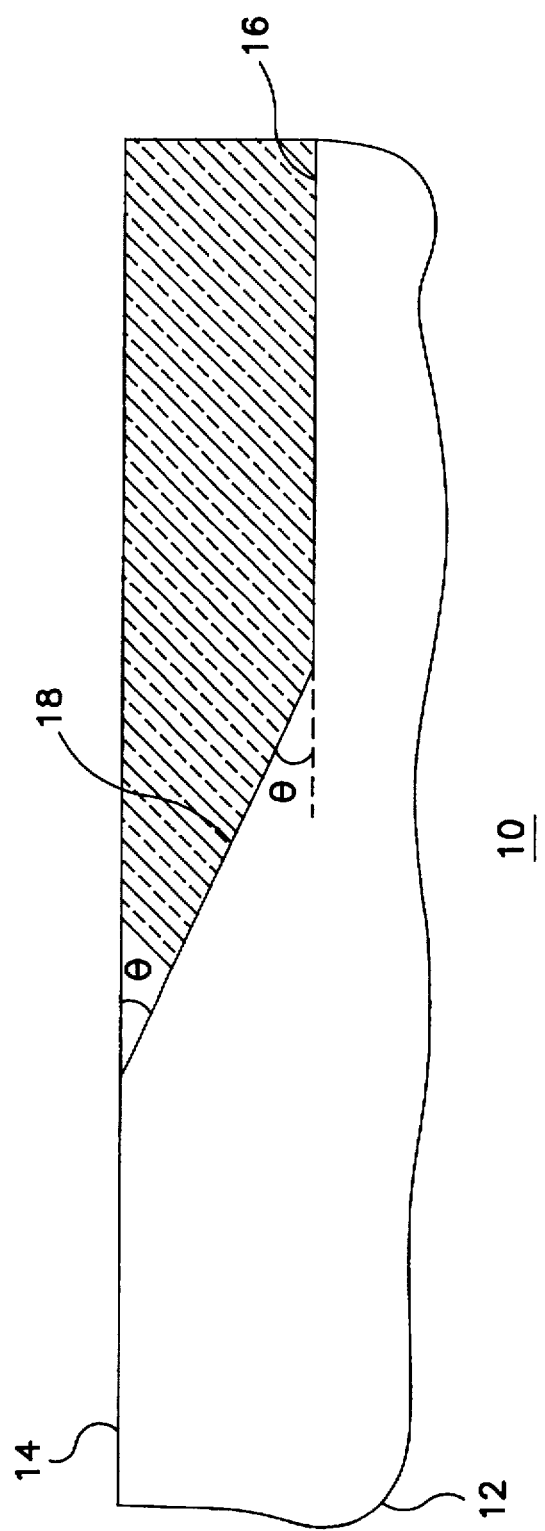
FIG. 2 illustrates a substrate etched according to the steps in FIG. 1.
Figure 3:
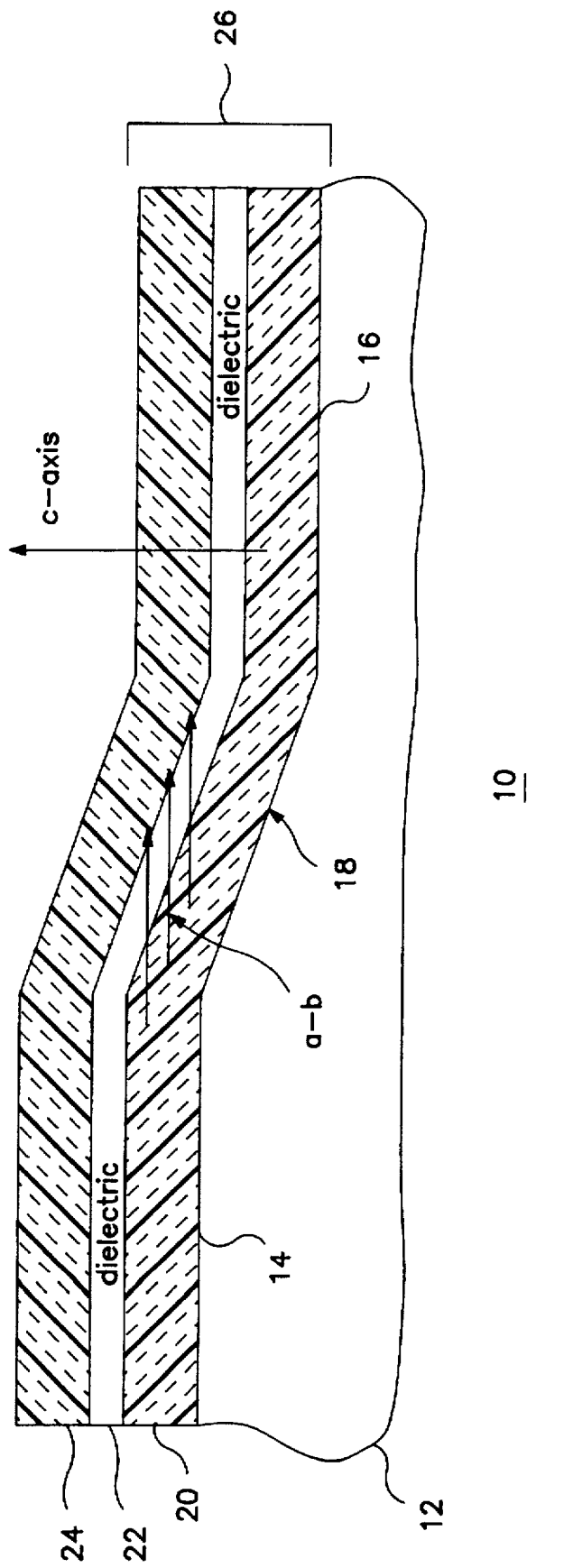
FIG. 3 illustrates a Josephson junction fabricated according to the steps in FIG. 1.

FIG. 1 illustrates a method of fabricating a Josephson junction 10 having a laminar structure shown in FIGS. 2–3 according to the present invention. The method comprises the steps of: (a) etching a planar substrate 12 to yield a first planar segment 14, a second planar segment 16, and a ramp segment 18, the ramp segment 18 connecting the two planar segments 14 and 16 at an angle $\ominus$ thereto, the substrate 12 adjacent the second planar segment 16 is thinner than the portion adjacent the first planar segment 14, and the geometry of the substrate 12 is one of a constantly decreasing thickness in the portion that underlies the ramp segment 18; (b) depositing a first superconductive layer 20 on the substrate 12; (c) depositing a non-superconductive layer 22 on the first superconductive layer 20; and (d) depositing a second superconductive layer 24 on the non-superconductive layer 22. Both superconductive layers 20 and 24, and the non-superconductive layer 22 are deposited in-situ and are epitaxial with a c-axis in a direction substantially normal to the plane of the first and second planar segments 14 and 16, and the layers are of substantially uniform thickness in the three segments.

Referring to FIG. 2, the substrate 12 is angle-etched at planned positions for forming junctions. The etch profile is produced during substrate preparation as a precursor step to depositing other layers on the substrate layer 12. The angle etch yields the ramp segment 18, and can be performed directly in the substrate, in epitaxial dielectric films on the substrate, or in epitaxial dielectric films on top of more films of HTS and dielectrics. The angle profile $\ominus$ of the ramp segment is at most about 45 degrees, and preferably less than about 30 degrees.

Referring to FIG. 3, the first super-conductive layer 20, the non-superconductive layer 22, and the second superconductive layer 24 form an epitaxial trilayer 26 on the substrate 12. The epitaxial trilayer 26 is deposited on the entire substrate 12 as three sequential in-situ steps, i.e. without breaking the vacuum. Because the etching process is performed on the substrate 12 rather than the first superconductive layer 20, advantageously, the first superconductive layer 20 over the ramp segment 18 is not damaged by the etching processes and contamination. As such, electrical quality, reproducibility and yield of the junction 10 is substantially improved.

The first and second superconductive layers 20 and 24 are preferably about 200 nm in thickness and are preferably high temperature superconductors such as RBCO (where R is a rare earth element such as Y), bismuth based copper oxide compounds, thallium based copper oxide compounds, and mercury copper oxide compounds. The non-superconductive layer 22 is preferably about 10 to about 20 nm in thickness and can be Co—YBCO, PrBCO, epitaxial dielectric or other epitaxial material structurally compatible with the superconductive layers for epitaxial growth. The non-superconductive layer 22 can also comprise normal conductors. The stated thicknesses of the superconductive and the non-superconductive layers are exemplary and can be varied to meet requirements of a given process, device and circuit design.

Figure 4:
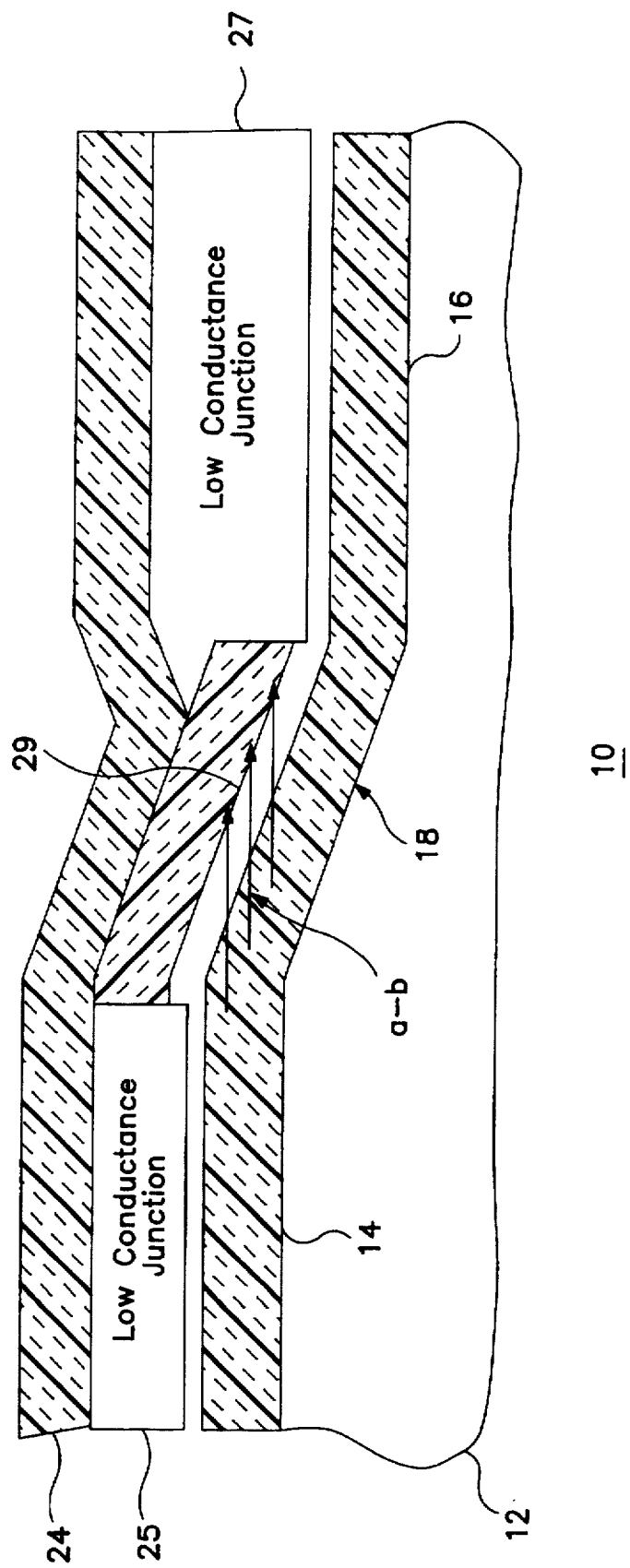
FIG. 4 illustrates the wiring connection to a Josephson junction fabricated according to the steps in FIG. 1.

Only the trilayers on the ramp segment 18 of the substrate 12 form an a-b plane conduction junction. The planar segments 14 and 16 of the trilayer 26 are c-axis junctions 25 and 27 with very low conductance. As shown in FIG. 4, conductance can be confined to the a-b plane conduction junction 29 by removing or disabling the c-axis junctions 25 and 27. The first planar segment 14 of the laminar structure can be removed after the step of depositing the second superconductive layer 24. The second planar segment 16 of the laminar structure can also be removed after the of depositing the second superconductive layer 24. Conductivity in the first planar segment 14 can be disabled after depositing the second superconductive layer 24 and similarly the conductivity in the second planar segment 16 can be disabled after the step of depositing the layer 24 thereby confining conductivity to the ramp segment of the laminar structure. Removing the c-axis junctions 25 and 27 can be achieved by etching. Disabling the c-axis junctions 25 and 27 can be achieved by ion implantation to inhibit conductivity across the c-axis junctions 25 and 27, leaving a discrete a-b plane junction. A counter-YBCO film of the junction can then be "wired" into an integrated circuit by a third superconductive layer which is deposited on the second superconductive layer 14 to provide electrical contact with the junction.

Junctions formed by the above method are substantially linear junctions. For 200 nm thick superconductive layers and a 30 degree ramp profile angle, the junction can be 400 nm wide in plan view. Fine lithography can be utilized to define the junction width and eliminate parasitic conduction in the c-direction. Inhibition ion implantation can be utilized to achieve such a physical size and enable epitaxial wiring.

Figure 5:
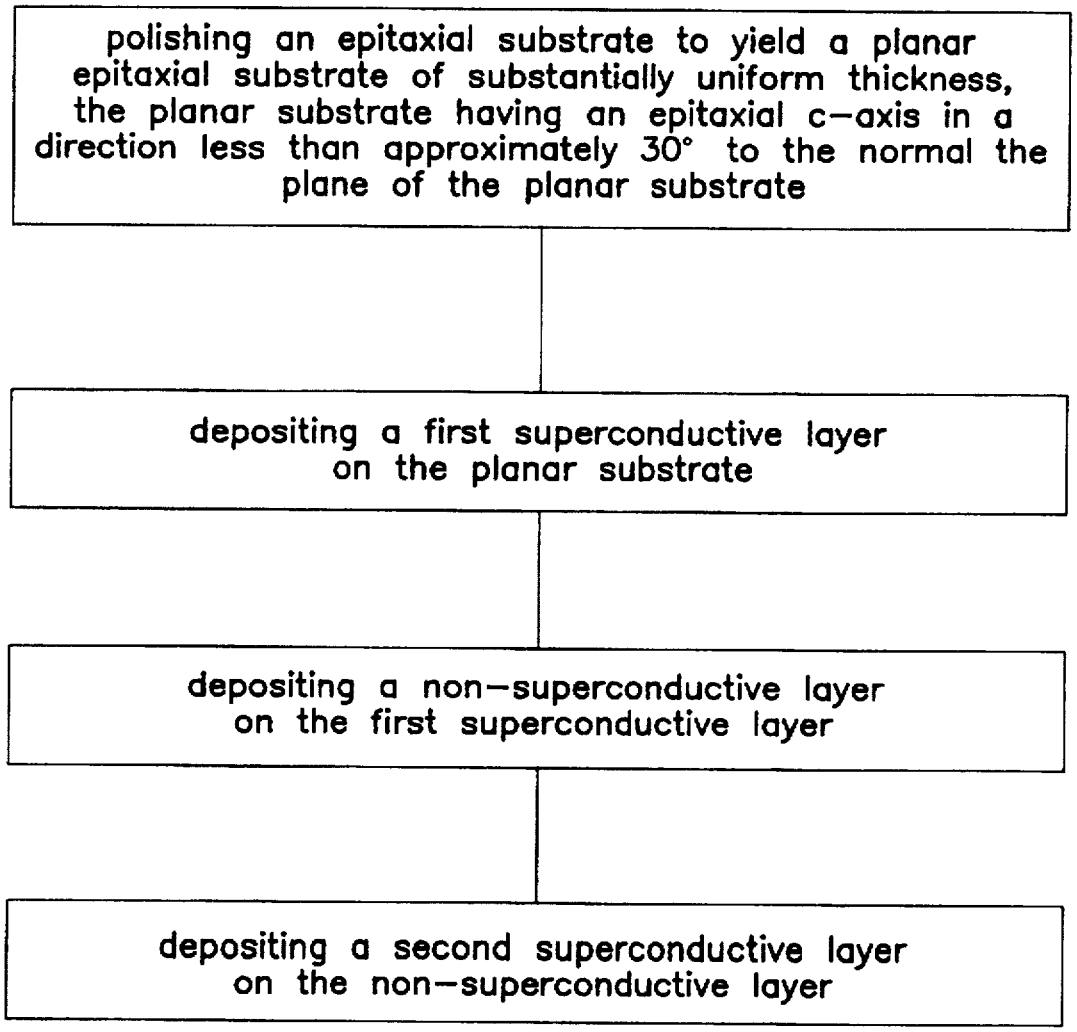
FIG. 5 illustrates the steps of fabricating a Josephson junction according to another aspect of the present invention.
Figure 6:
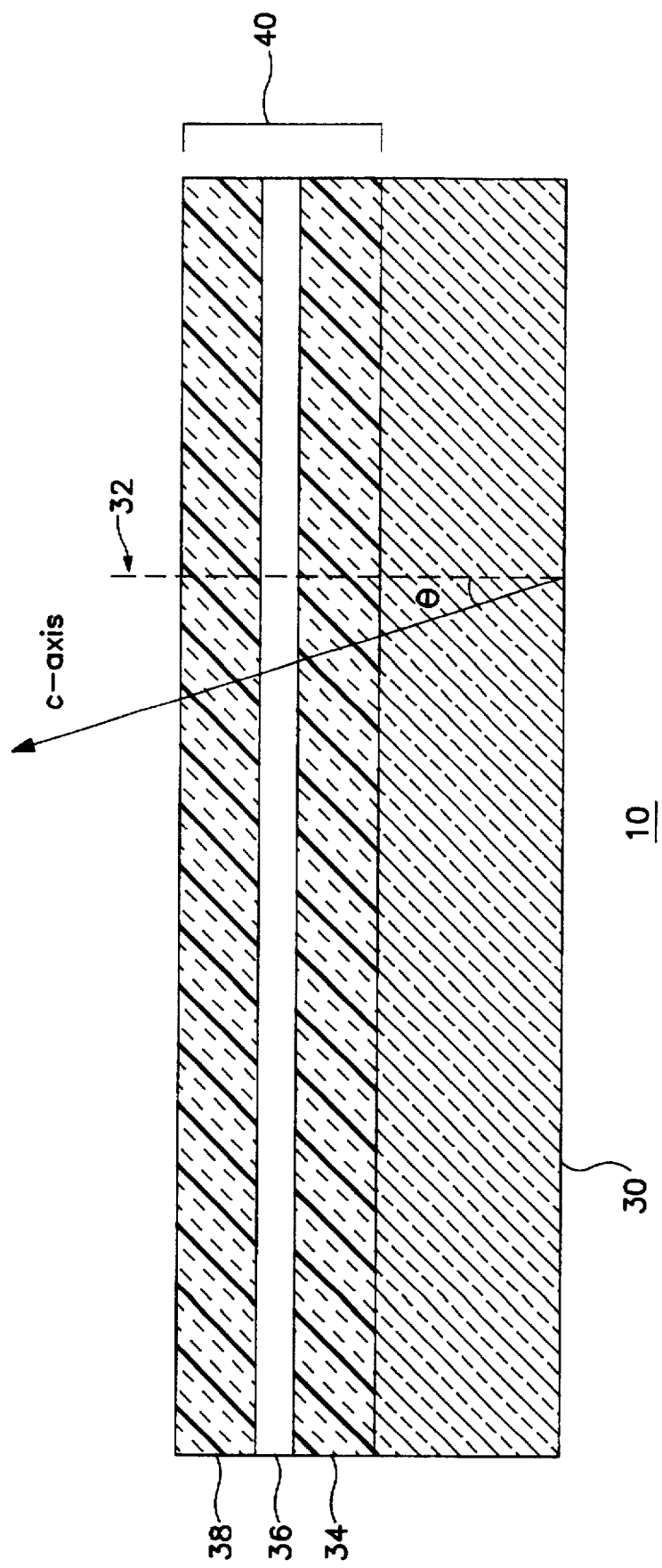
FIG. 6 illustrates a Josephson junction fabricated according to the steps in FIG. 5.
Figure 7:
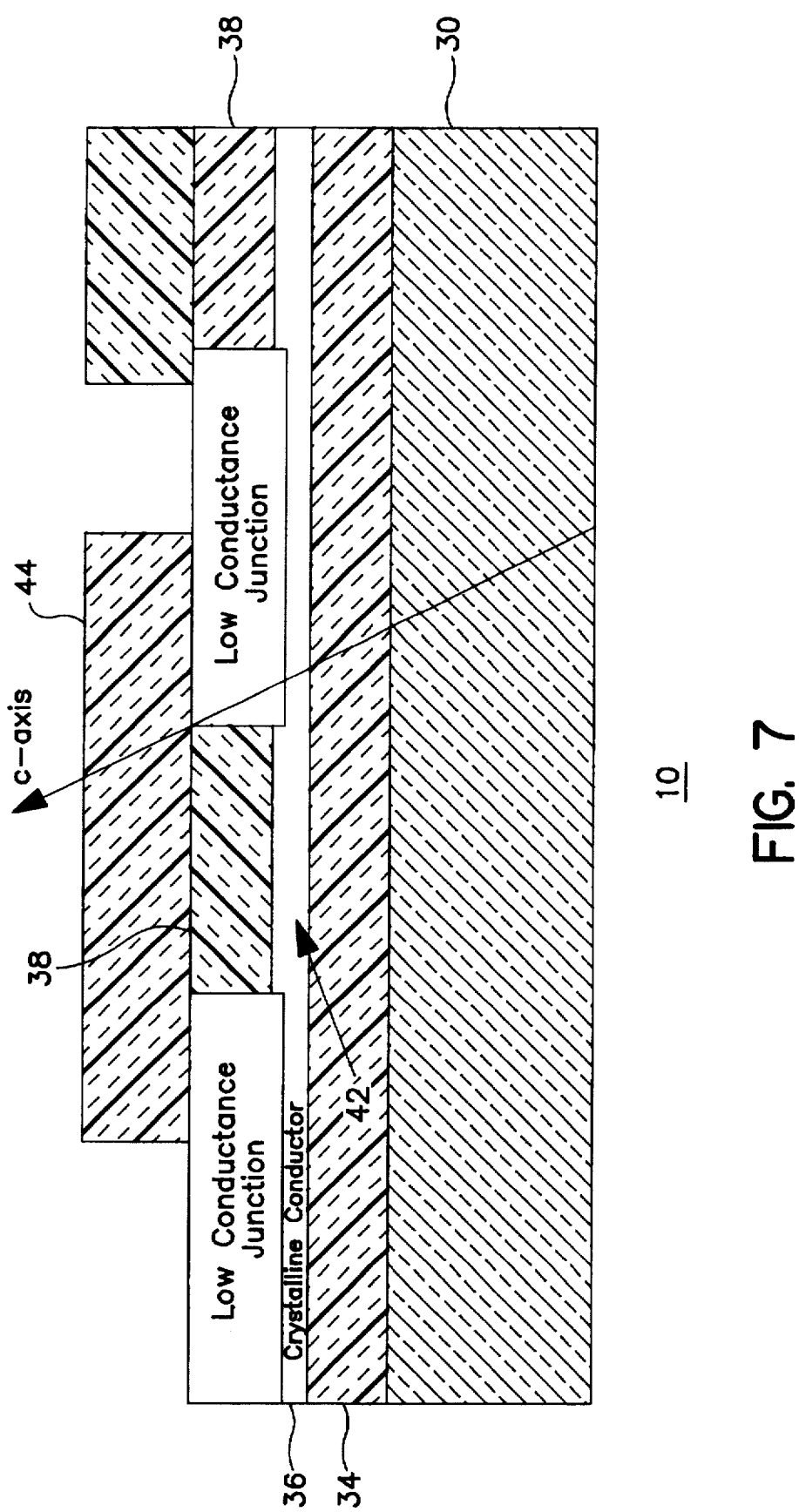
FIG. 7 illustrates a junction vertical profile wired by reactive ion implant process according to steps in FIG. 5.

FIG. 5 illustrates a method of fabricating a Josephson junction shown in FIGS. 6–7 according to another aspect of the present invention. The method comprises the steps of: (a) polishing an epitaxial substrate to yield a planar epitaxial substrate 30 of substantially uniform thickness, the planar substrate having an epitaxial c-axis at an acute angle to the normal 32 to the plane of the planar substrate; (b) depositing a first superconductive layer 34 on the planar substrate 30; (c) depositing a non-superconductive layer 36 on the first superconductive layer 34; and (d) depositing a second superconductive layer 38 on the non-superconductive layer 36. Both the superconductive layers 34 and 38, and the non-superconductive layer 36 are epitaxial with a c-axis in a direction substantially parallel to the c-axis of the planar substrate 30. The first superconductive layer 34, the non-superconductive layer 36 and the second superconductive layer 38 are of substantially uniform thickness, whereby the laminar structure is substantially planar.

The substrate is prepared by cutting and polishing the entire substrate at an angle $\ominus$ of at most about 45 degrees to the normal 32 to the plane of the surface of the substrate 30. Preferably, an angle of less than about 30 degrees is selected to ensure epitaxial growth on the substrate 30 at around 800° C. Angle cutting the entire substrate eliminates the problems of local patterning of the first superconductive layer 34 and produces a uniform reproducible surface for growing epitaxial films and junctions.

Referring to FIG. 6, the first superconductive layer 34, the non-superconductive layer 36 and the second superconductive layer 38 form an epitaxial trilayer 40 on the substrate 30. The epitaxial trilayer 40 is deposited in-situ on the entire surface of the substrate 30 as three sequential steps producing a uniform trilayer junction 42 across the entire surface of the substrate in an anisotropic epitaxial material system. As such, advantageously, the junction has a planarized topology which simplifies processing, improves electrical performance, and increases circuit robustness and yield.

The substrate 30 can be between about 10 to 40 mils in thickness as desired. The superconductive layers 34 and 38 can be between about 100 to about 200 nm in thickness. The non-superconductive layer 36 is preferably between about 10–20 nm in thickness. The stated thicknesses of the superconductive and the non-superconductive layers are exemplary and can be varied to meet requirements of a given process, device and circuit design.

Suitable substrates are chemically compatible and non-reactive with HTS films up to temperatures of at least 750–800 degrees at which epitaxial HTS films are deposited. The substrate 30 can be an epitaxial wafer such as LaAlO3, SrTiO3, SrAlTaO, or NdGaO3. The superconductive layers 34 and 38 can be selected from the group consisting essentially of high temperature superconductors such as YBCO, bismuth based copper oxide compounds, thallium based copper oxide compounds, and mercury copper oxide compounds. The non-superconductive layer 36 can be Co—YBCO, PrBCO, epitaxial dielectric, or other epitaxial materials structurally compatible with the superconductive layers for epitaxial growth.

Referring to FIG. 7, the junction 42 can be patterned by either inhibition ion implantation to inhibit conductivity, or by ion milling. Inhibition ion implanting leaves a planar epitaxial crystalline surface for a wiring layer. Ion milling requires deposition of an insulating dielectric film before the wiring layer.

In addition to the first superconductive layer 34, before depositing the non-superconductive layer 36, other layers such as superconducting films, dielectric films or ion implants can be deposited on the substrate as required for a specified IC process by growing epitaxial c-axis films aligned with the crystal direction of the substrate. Such layers can be grown at c-axis angles of less than about 35 to 40 degrees depending on the crystal direction of the substrate. Further, wire-up superconductive layers 44 can be deposited on the second superconductive layer 30.

The method of the present invention provides a way of shaping junctions as desired consistent with lithography and circuit design considerations. Inhibition ion implant is advantageous for fine line lithography because it is automatically self-aligned and planar, and does not require complex planarization and/or making of inside contacts. The method of the present invention can be utilized with normal conductor, semiconductor, and insulating barrier formation without uncontrolled interfaces, permitting fabrication of different junction types such as overdamped and underdamped junctions.

The method of the present invention can also be utilized to fabricate low resistance ohmic contacts by forming such contacts to the a-b plane of the junctions. For example, using the angle cut substrate with inhibition ion implantation patterning, the surface of the superconductive layer to be contacted exposes a-b plane conducting facets at an angle to the next film. Contact conductance can further be enhanced by etching the surface of the superconductive film to form interdigital contacts which increase exposure of a-b surfaces. By making the normal conductor contact in situ with the superconductive layer deposition, a high conductance contact to the highly conductive a-b plane can be obtained.

To make small superconducting contacts with high critical current capability between different superconductive films for wiring and interconnections, plug contacts can be utilized through vias in insulating films. The plugs can be produced by inhibition ion implanting an intervening superconductive film to form the contact plugs, and then depositing a second superconductive wiring film. By stacking the superconductive films with exposed a-b plane surfaces, the quantity of supercurrent per contact area is improved.

Inhibition ion implantation implants ions at energies and dose levels which inhibit superconductivity and normal conductivity with minimal effect on the crystal structure of HTS films. Dose levels which make the films amorphous are not contemplated by the invention.

The present invention has been described in considerable detail with reference to certain preferred versions thereof;

however, other versions are possible. Therefore, the spirit and scope of the appended claims should not be limited to the description of the preferred versions contained herein.

What is claimed is:

1. A method of fabricating a Josephson junction having a laminar structure, the method comprising the steps of:
   (a) etching a planar substrate to yield a first planar segment, a second planar segment, and a ramp segment, the ramp segment connecting the two planar segments at an angle thereto, the substrate being thinner in the second planar segment than in the first planar segment, and the substrate having a constantly-decreasing thickness in the ramp segment;
   (b) depositing a first superconductive layer on the substrate;
   (c) depositing a non-superconductive layer on the first superconductive layer; and
   (d) depositing a second superconductive layer on the non-superconductive layer;
   wherein both superconductive layers and the non-superconductive layer are deposited in-situ and are epitaxial with a c-axis in a direction substantially normal to the plane of the first and second planar segments; and
   wherein the layers are of substantially uniform thickness in the three segments.

2. The method of claim 1 wherein the step of etching includes etching the substrate so that the angle of the ramp segment to the planar segments is at most about 45 degrees.

3. The method of claim 2 wherein the angle is less than about 30 degrees.

4. The method of claim 1 wherein the non-superconductive layer comprises a normal conductor.

5. The method of claim 1 wherein:
   (a) the first superconductive layer comprises a high temperature superconductor; and
   (b) the second superconductive layer comprises a high temperature superconductor.

6. The method of claim 1 further comprising the step of removing the first planar segment of the laminar structure after the step of depositing the second superconductive layer.

7. The method of claim 6 further comprising the step of removing the second planar segment of the laminar structure after the step of depositing the second superconductive layer.

8. The method of claim 1 further comprising the step of disabling conductivity in the first planar segment of the laminar structure after the step of depositing the second superconductive layer to substantially confine conductivity to the ramp segment of the laminar structure.

9. The method of claim 8 further comprising the step of disabling conductivity in the second planar segment of the laminar structure after the step of depositing the second superconductive layer to substantially confine conductivity to the ramp segment of the laminar structure.

10. The method of claim 1 further comprising the step of depositing a third superconductive layer on the second superconductive layer to provide electrical contact with the junction.

11. A method of fabricating a Josephson junction having a laminar structure, the method comprising the steps of:
    (a) etching a planar substrate to yield a first planar segment, a second planar segment, and a ramp segment, the ramp segment connecting the two planar segments at an angle of at most about 45 degrees thereto, the substrate being thinner in the second planar segment than in the first planar segment, and the substrate having a constantly-decreasing thickness in the ramp segment;
    (b) depositing a first high temperature superconductive layer on the substrate;
    (c) depositing a non-superconductive layer on the first superconductive layer;
    (d) depositing a second high temperature superconductive layer on the non-superconductive layer; and
    (e) confining conductivity to the ramp segment of the laminar structure;
    wherein both superconductive layers and the non-superconductive layer are epitaxial with a c-axis in a direction substantially normal to the plane of the first and second planar segments; and
    wherein the layers are of substantially uniform thickness in the three segments.

12. The method of claim 11 wherein the step of etching includes etching the substrate so that the angle of the ramp segment to the planar segments is less than about 30 degrees.

13. The method of claim 11 wherein the non-superconductive layer comprises a normal conductor.

14. The method of claim 11 wherein the step of confining conductivity to the ramp segment includes removing the first planar segment of the laminar structure.

15. The method of claim 14 wherein the step of confining conductivity to the ramp segment includes removing the second planar segment of the laminar structure.

16. The method of claim 11 wherein the step of confining conductivity to the ramp segment includes disabling conductivity in the first planar segment of the laminar structure.

17. The method of claim 16 wherein the step of confining conductivity to the ramp segment includes disabling conductivity in the second planar segment of the laminar structure.

18. The method of claim 11 further comprising the step of depositing a third superconductive layer on the second superconductive layer to provide electrical contact with the junction.

* * * * *